United States Patent [19]

Higa

[11] Patent Number: 5,537,736
[45] Date of Patent: Jul. 23, 1996

[54] TOOL FOR REMOVING MICROCHIP MODULES FROM THEIR SOCKETS

[76] Inventor: Lawrence R. Higa, 2932 Fulton St., San Francisco, Calif. 94118

[21] Appl. No.: 337,448

[22] Filed: Nov. 8, 1994

[51] Int. Cl.⁶ .................................................. B23P 19/04
[52] U.S. Cl. .............................................. 29/764; 29/253
[58] Field of Search ........................... 29/740, 741, 758, 29/764, 253, 278, 279; 7/107; 31/3.55

[56] References Cited

U.S. PATENT DOCUMENTS

| 3,785,033 | 1/1974 | Lynch ........................................ 29/764 |
| 4,583,287 | 4/1986 | McDevitt et al. ..................... 29/758 X |
| 5,163,211 | 11/1992 | Rubino et al. ......................... 29/764 X |

FOREIGN PATENT DOCUMENTS

| 184737 | 8/1963 | Sweden ................................... 29/764 |
| 806396 | 2/1981 | U.S.S.R. ................................. 29/764 |

OTHER PUBLICATIONS

"Individual Chip Separation Device" Disclosed Anonymously, Research Disclosure, Kenneth Mason Publication Ltd. England, No. 329, Sep. 1991.

*Primary Examiner*—Peter Vo
*Attorney, Agent, or Firm*—Shlesinger Arkwright & Garvey

[57] ABSTRACT

A tool for removing a rectangular microchip module from a corresponding pin holding socket gripping a pin lead array extending downwardly from the module is described. The tool comprises a plurality of wedge-shaped prongs positioned around a lower periphery of the tool at intervals corresponding with the position of corners of the module. The prongs, preferably one for each corner of the module, are simultaneously wedgeable between the socket and the corners to lift said module away from the socket upon rotation of the tool.

11 Claims, 8 Drawing Sheets

TOOL FOR REMOVING MICROCHIP MODULES FROM THEIR SOCKETS

FIELD OF THE INVENTION

This invention relates to microchip packages or modules of the pin grid array type, and in particular to tools which facilitate removal of such modules from corresponding pin holding sockets.

BACKGROUND TO THE INVENTION

Microchip modules of the pin grid array type come in a variety of shapes and sizes. Many, but not all, have an overall rectangular configuration (it being understood that rectangular configurations include the special case of square configurations). Others will have an overall circular configuration. However, it is modules of the rectangular type with which the present invention is concerned.

The removal of microchip modules from sockets which grip pin lead arrays extending downwardly from the modules can be an awkward task. Complaint and expressions of frustration are not uncommon. The grip by a socket on the pins can be very tight, particularly when there are a large number of pins in the array, and it can be difficult for a technician to get a firm hold on the module. Further, any twisting which takes the alignment of the pins away from the vertical can have a binding effect which makes the process of removal even more difficult.

Screwdrivers or other devices having a knife edge or end which can be wedged between a module and its corresponding socket are frequently used to assist the process of removal. However, such devices are often not well suited to the task and at best can work on only one side of the module at a time. The user may be required to work progressively around the module gradually wiggling it up from the socket.

Corkscrew devices specifically adapted to the task of removing microchip modules are also known. These more sophisticated devices serve to pull the module straight up while holding the corresponding socket down. However, such devices are relatively costly and unnecessarily complicated for the purpose.

Accordingly, a primary object of the present invention to provide a new and improved tool for removing microchip modules from their corresponding sockets; a tool which is easy to use and which works quickly and cleanly to perform the required task.

A further object of the present invention is to provide a tool of the foregoing type which is simple in construction and easy to manufacture.

SUMMARY OF THE INVENTION

In a broad aspect of the present invention, there is provided a tool for removing a rectangular microchip module from a corresponding socket gripping a pin lead array extending downwardly from the module, the tool comprising an upper portion and a lower portion the lower portion merging with and extending downwardly about a vertical axis of the tool from the upper portion to a lower periphery of the lower portion, and a plurality of wedge-shaped prongs positioned around the lower periphery at intervals corresponding with the position of corners of the module. The prongs are simultaneously wedgeable between the socket and the corners to lift the module away from the socket upon rotation of the upper and lower portions about the vertical axis.

In a preferred embodiment, each prong extends horizontally from a rearward side of a corresponding opening formed in the lower periphery of the tool towards a forward side of the opening. A leading end of the prong is distanced from the forward side by a gap permitting a corresponding corner of the module to be received upwardly in the opening. Advantageously, the lower periphery, the openings and the prongs may all be formed as an integral part of a thin wall construction.

To use the tool, it is merely necessary to match the prongs with corners of the module and then, with the turn of a wrist, rotate the tool to wedge the prongs between the socket and the corners. The pin lead array will prevent the module from rotating with the tool. The only direction that the module can go is straight up from the socket.

The lower periphery of the tool may be circular or non-circular such as rectangular (including square) or oval. Advantageously, it may be rectangular with rounded corners, with the openings and the prongs being positioned at the corners. With such a configuration, the footprint of the tool as represented by the area within the outside of its lower periphery need not extend much beyond the perimeter of the microchip. This may serve to avoid contact with other components positioned near the microchip and which could interfere with the use of a tool having a larger footprint.

The avoidance of contact with other components may also be addressed by giving the tool a configuration wherein each prong forms the foot of a corresponding leg extending downwardly from a top portion of the tool to the lower periphery. In this case, the lower periphery of the tool is basically represented by the horizontal extension of the prongs at the foot of each leg. The gaps between legs serve to avoid contact with other components. But, while serving to avoid such contact, it may be noted that a legged configuration will be more delicate and not as resistant to abuse as a structure which does not have such gaps—and moreso depending upon the thinness of the legs.

While it is generally contemplated that a given tool will be designed for a given size of microchip module with preferably four prongs—one for each corner of the module, it is possible to design a tool in accordance with the present invention that can be used for more than one size of module.

The foregoing and other features and advantages of the present invention will now be described with reference to the drawings.

DETAILED DESCRIPTION

Figure 1:
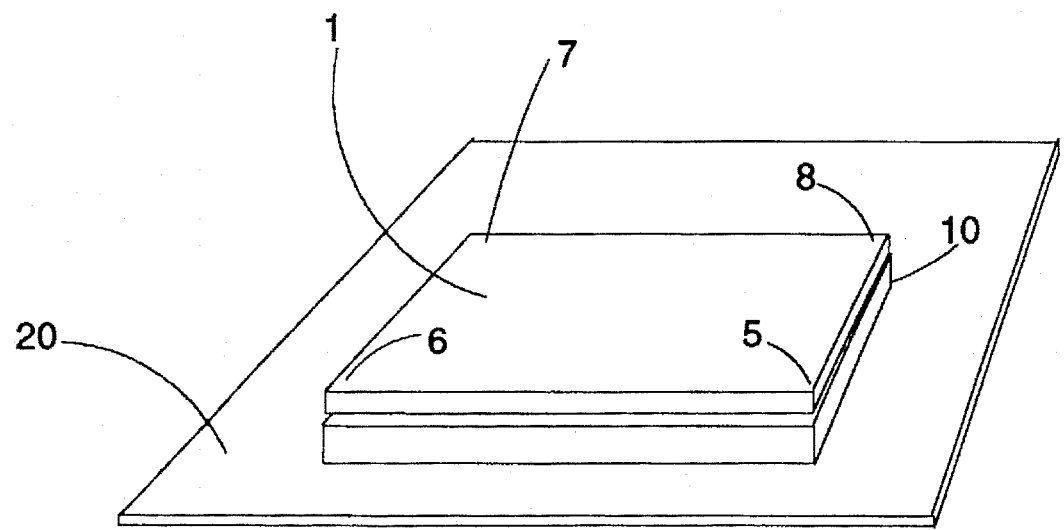
FIG. 1 is a projection view of a representative microchip module held by its corresponding socket.
Figure 2:
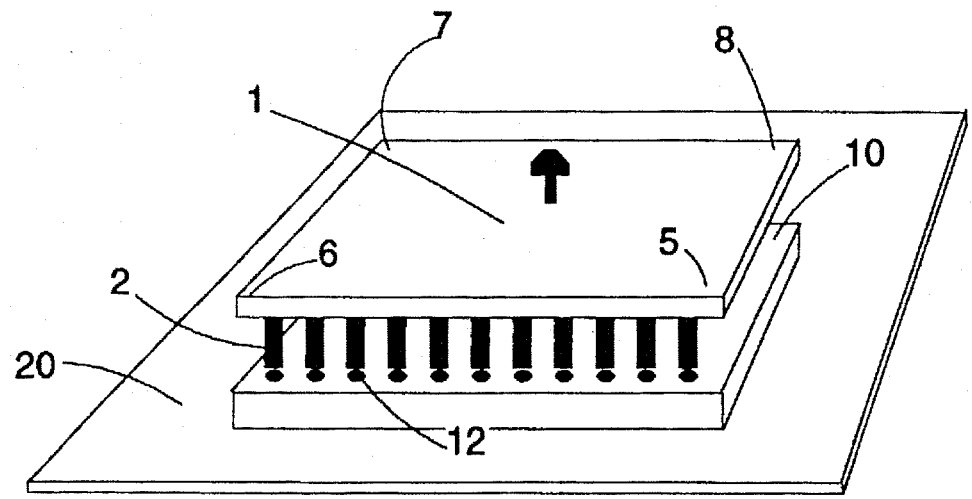
FIG. 2 is a projection view of the module and socket shown in FIG. 1 after the module has been removed from the socket.

FIGS. 1 and 2 depict a rectangular, basically square, microchip module 1 with corners 5, 6, 7 and 8, a corresponding base or carrier socket 10, and a portion of a motherboard 20 to which socket 10 is normally fixedly attached. Two positions are shown. In FIG. 1, module 1 is completely plugged in socket 10 for normal operation. In FIG. 2, module 10 has been removed from socket 10 thereby exposing a plurality of pins 2 which form part of a pin lead array extending downwardly from the module (the remaining part being hidden from view). A number of elemental sockets 12 forming part of socket 10 also lie exposed in FIG. 2. When module 1 is plugged in socket 10 as shown in FIG. 1, each elemental socket 12 engages and grips a corresponding pin 2 of module 1.

FIGS. 1 and 2 merely serve to illustrate the basic problem which is to unplug or remove module 1 from the engaged position shown in FIG. 1 to the separated position shown in FIG. 2. The number of pins 2 which are indicated is rather arbitrary and only for the purpose of illustration. In practice, a module may have a greater or lesser number of pins. However, it should be noted that the placement of pins 2 is set back from corners 5, 6, 7 and 8. As will become more apparent hereinafter, the tool of the present invention could not be used without the set back characteristic.

Figure 3:
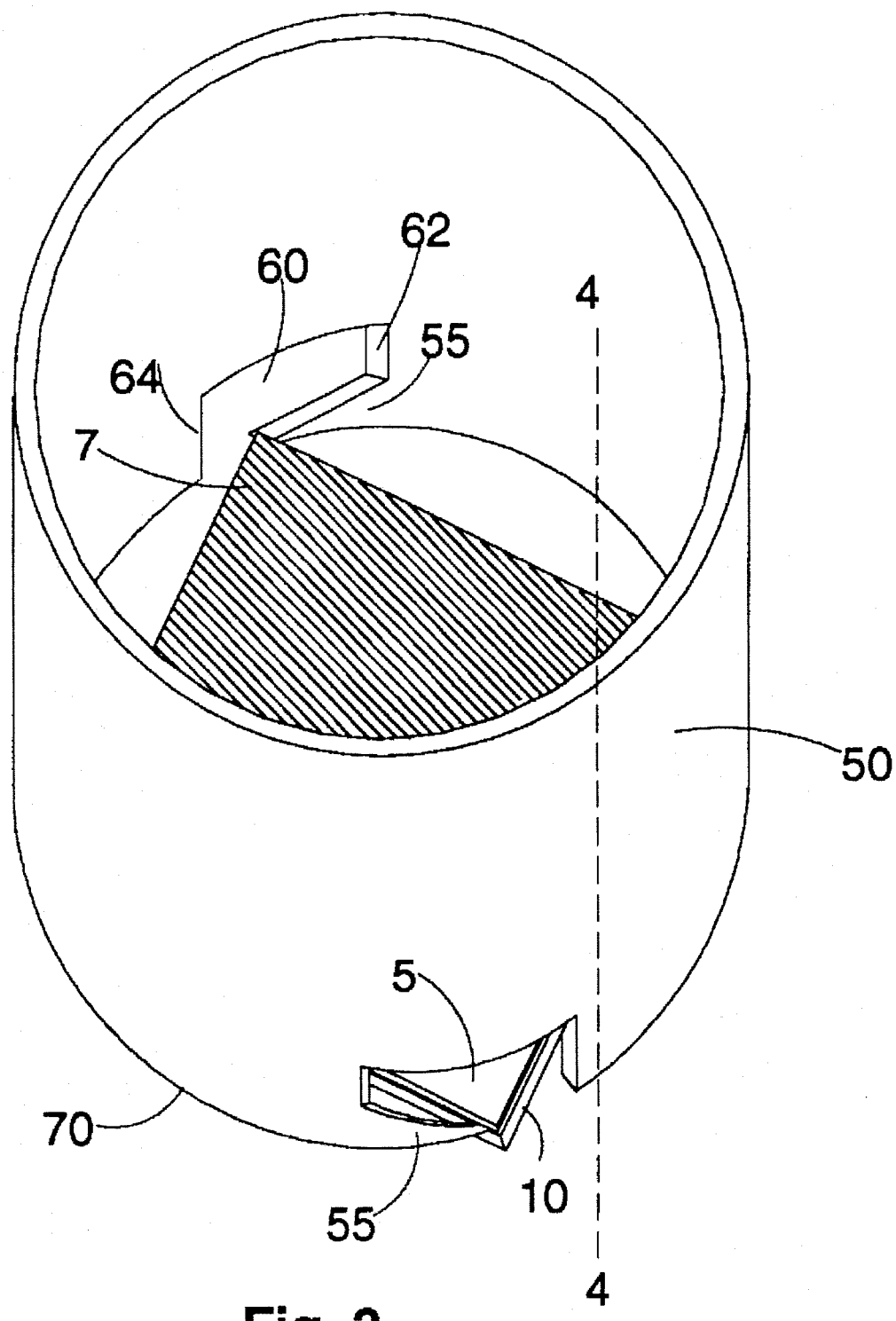
FIG. 3 is an axiometric view of a cylindrical removal tool in accordance with the present invention positioned to engage the module shown in FIG. 1.
Figure 4:
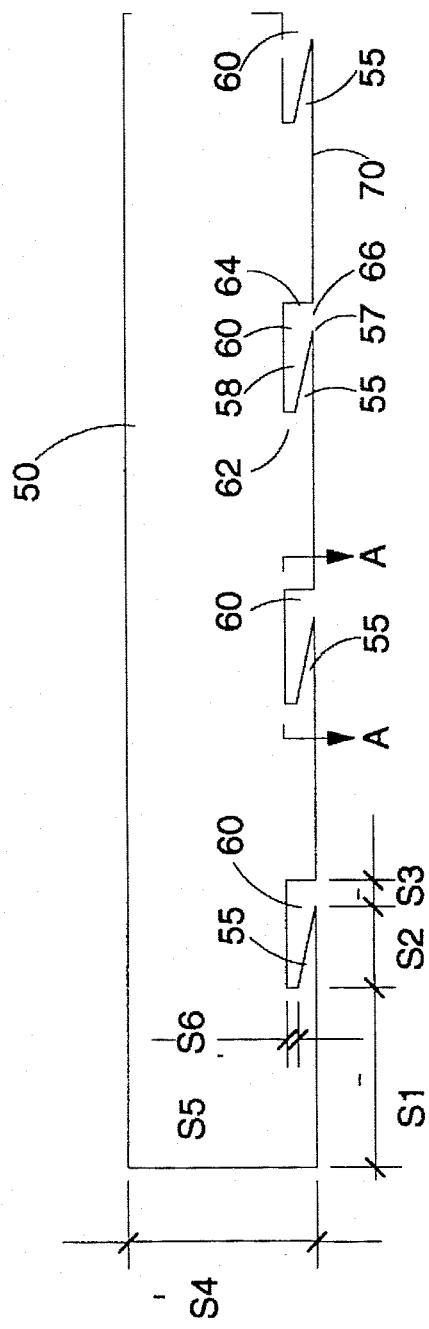
FIG. 4 is a side view of the tool shown in FIG. 3 when mapped to a flat plane.
Figure 5:
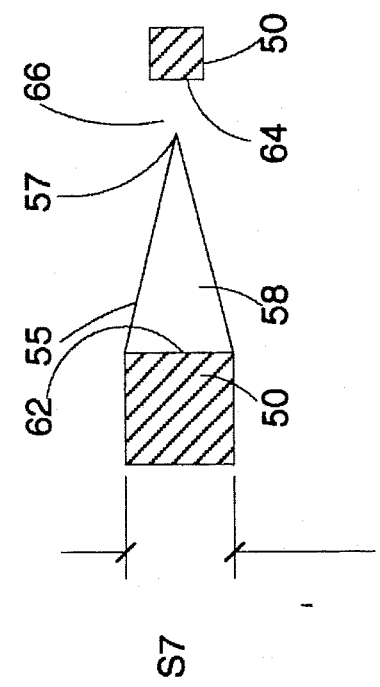
FIG. 5 is a top view of a prong taken along section A—A in FIG. 4.

FIG. 3 illustrates a removal tool 50 in accordance with the present invention which has been positioned to remove module 1 from socket 10. To better illustrate the complete structure, FIG. 4 shows the same tool when separated along vertical broken line 4—4 in FIG. 3; then opened or mapped to a flat plane. FIG. 5 illustrates any one of the prongs in FIG. 3 when viewed from above along section line A—A in FIG. 4.

As can be seen in FIGS. 3 to 5, tool 50 has a thin wall cylindrical construction which includes four integrally formed wedge-shaped prongs 55 formed in openings 60 in lower periphery 70 of the tool. Lower periphery 70 is substantially circular, the positions of prongs 55 being at intervals corresponding with the positions of corners 5, 6, 7 and 8 of module 1. Since module 1 is basically square, and since lower periphery 70 is substantially circular, the angular spacing between such intervals is substantially 90°.

Each prong 55 extends horizontally from a rearward side 62 of an opening 60 towards a forward side 64 and, as may be better seen in FIG. 5, has a tip or leading end 57 distanced away from side 64 by a gap 66 which permits a corresponding corner 5, 6, 7 or 8 of module 1 to be received upwardly in the opening. Each prong also includes a sloped or wedge surface 58 to provide wedging action as described below.

Figure 6:
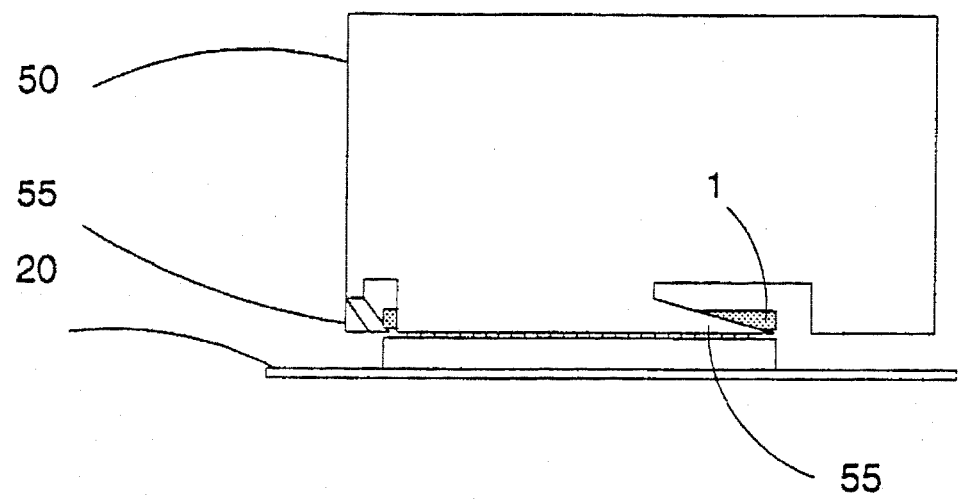
FIG. 6 is a side elevation view of the tool shown in FIG. 3 positioned to begin removing the module shown in FIG. 1 from its socket.
Figure 7:
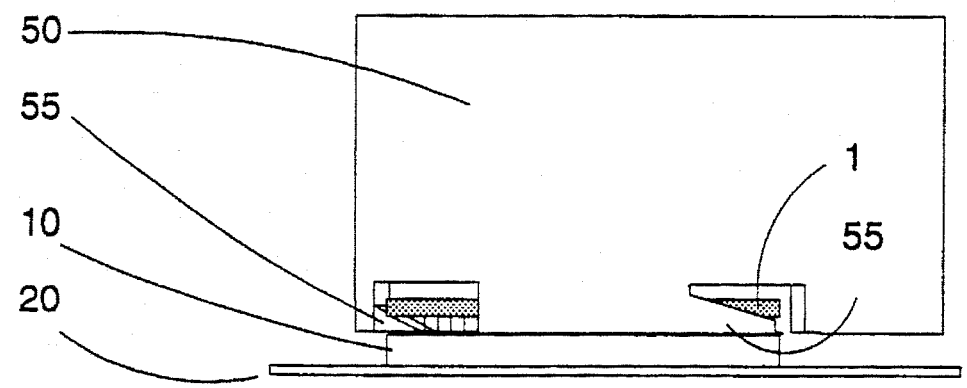
FIG. 7 is a side elevation view of the tool shown in FIG. 3 showing the module of FIG. 1 partially removed from its socket.
Figure 8:
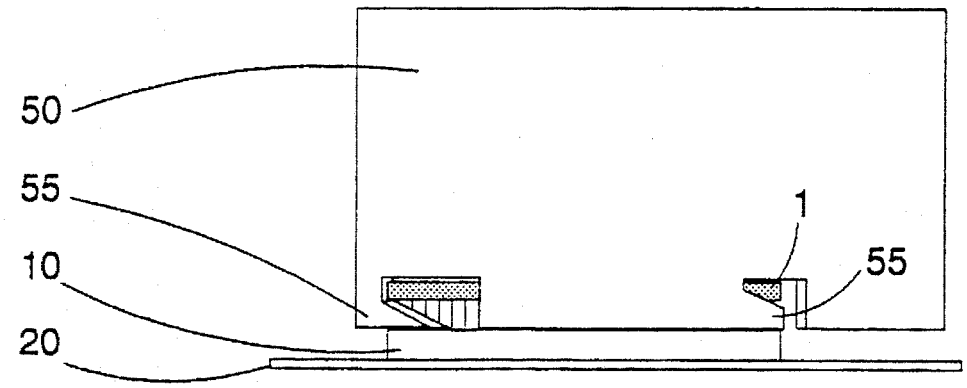
FIG. 8 is a side elevation view of the tool shown in FIG. 3 showing the module of FIG. 1 fully removed from its socket.

FIGS. 6, 7 and 8 illustrate the use of tool 50 to remove module 1 from socket 10. In FIG. 6, the tool has been placed so that the leading ends 57 of the prongs are marginally inserted under corners 5, 6, 7 and 8 of module 1. The user then begins to rotate the tool about its vertical axis thereby simultaneously wedging the prongs between socket 10 and the corners of module 1. It is of course understood that leading ends 57 should be sufficiently sharp and the slope of wedge surfaces 58 sufficiently gradual to allow such wedging action to occur.

As the prongs are forced under the corners of module 1 by rotation of tool 50, wedging action lifts module 1 partially away from socket 10 to the intermediate position shown in FIG. 7. In FIG. 7, it can be seen that the position of tool 50 is rotated slightly compared to that in FIG. 6. As well, module 1 has been carried part of the way up wedge surfaces 58. However, pins 2 of module 1 still remain partly engaged by socket 10. The engagement of the pins prevents module 1 from rotating with tool 50 and forces the module to lift straight up from the socket.

As tool 50 is rotated further, prongs 55 continue to lift module 1 away from socket 10 until pins 2, and necessarily the module, are completely disengaged as shown in FIG. 8. At this point, the entire tool with the module carried along can be lifted away free of the socket.

In the actual use of tool 50, the stages represented by FIGS. 6, 7 and 8 are normally part of one continuous, quick operation. Once prongs 55 are properly aligned with the corners of module 1, then a simple turn of the wrist to rotate the tool will lift the module from socket 10.

By way of example, a removal tool similar to that shown in FIGS. 3 to 8 was fabricated from aluminum with the following approximate dimensions s1 to s7 depicted in FIGS. 4 and 5:

| s1: | 3.245 cm | s5: | 0.35 cm |
|---|---|---|---|
| s2 | 1.50 cm | s6: | 0.20 cm |
| s3 | 0.50 cm | s7: | 0.20 cm |
| s4 | 3.50 cm | | |

This tool was found to work well for the removal of Motorola 68040 microprocessor modules used as the CPU in Macintosh computers. For this case, it may be noted that when the pins of the module are fully inserted in the socket then the body of the module lies about 0.1 cm above the socket.

The use of aluminum is of course not essential. Various other materials such as other metals or hardened plastics or polycarbonates should also be suitable.

It should be understood that the lower periphery of a removal tool in accordance with the present invention need not be substantially circular as it is in the case of tool 50. The key condition is that the positions of the prongs correspond with the positions of corners of the microchip module to be removed so that the required wedging action at the corners can occur when the tool is engaged and rotated. This requirement is best illustrated by FIGS. 9, 10 and 11, which show top views of three differing removal tools in accordance with the present invention, each located in a position where the prongs (not shown) of the tool are engaging corresponding corners of a microchip module.

Figure 9:
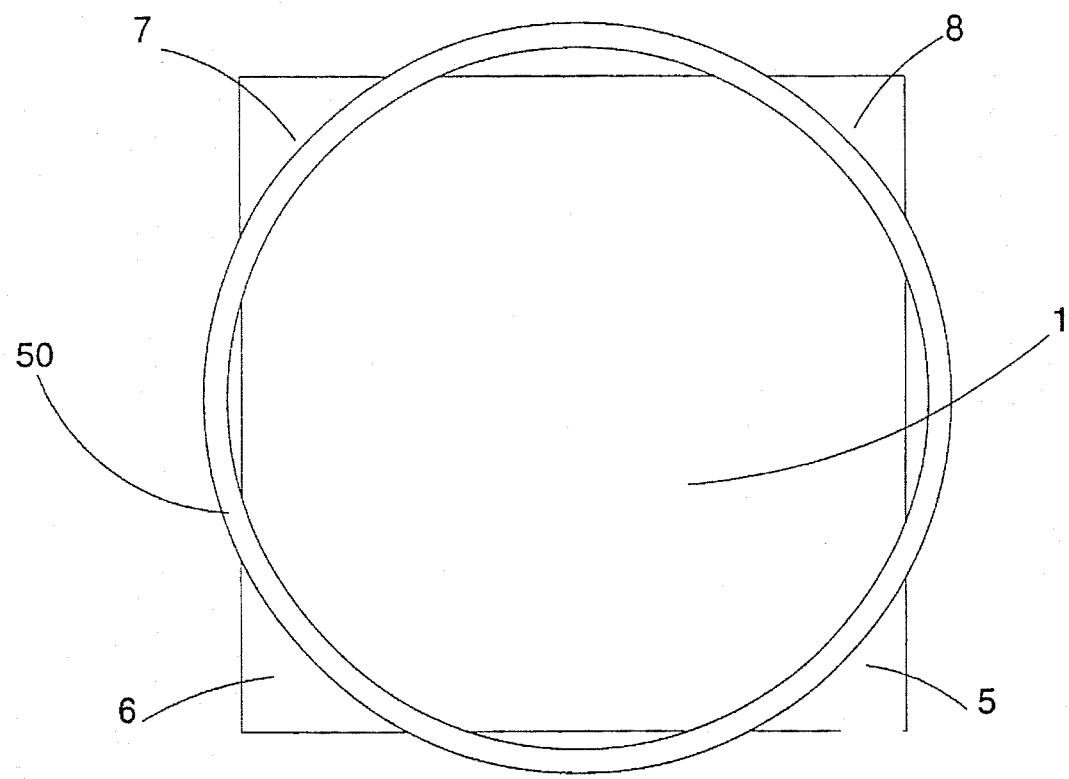
FIG. 9 is a top view of the tool shown in FIG. 3 engaging the module shown in FIG. 1.

FIG. 9 is a top view of tool 50 engaging microchip module 1. As can be seen, corners 5, 6, 7 and 8 of module 1 each project slightly beyond the lower periphery of the tool. Although not visible in FIG. 9, these projections are as described above through openings 60 in lower periphery 70 of the tool.

Figure 10:
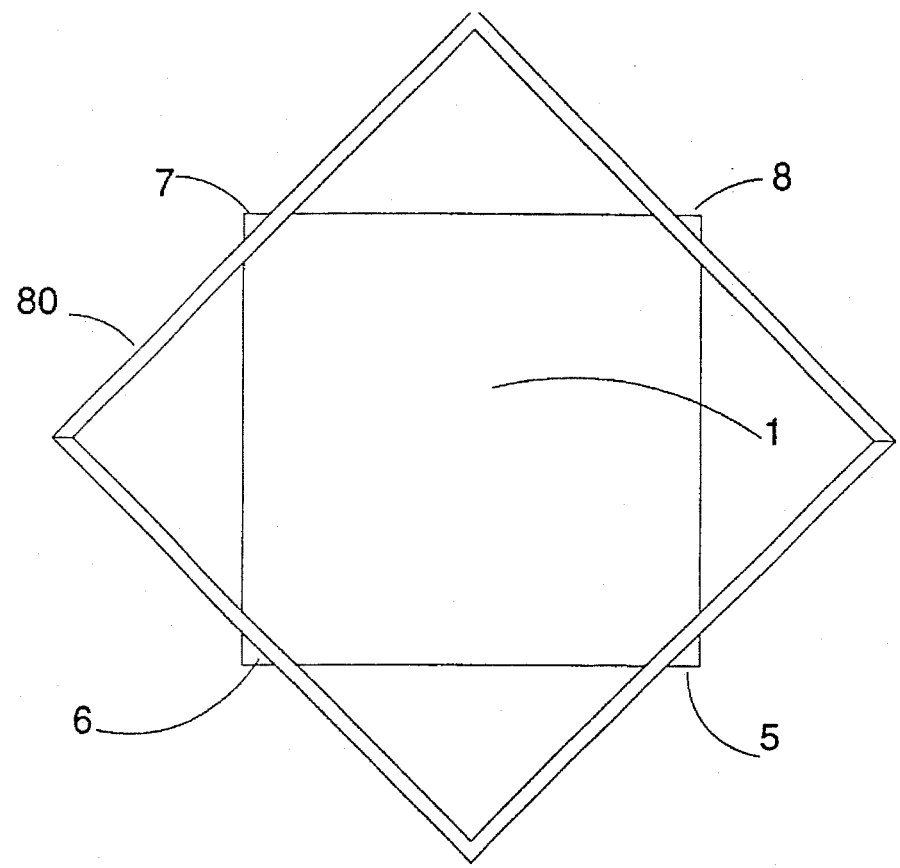
FIG. 10 is a top view of a rectangular tool in accordance with the present invention engaging the module shown in FIG. 1.

FIG. 10 serves to illustrate that a removal tool 80, the lower periphery of which is substantially square, could also be used to remove microchip module 1. As in the case of tool 50, tool 80 has a thin wall construction. But, unlike tool 50 which has a substantially circular cross-section, the cross-section of tool 80 is substantially square. On tool 80, prongs (not visible) and openings (likewise not visible) for receiving corners 5, 6, 7 and 8 are positioned around the lower periphery mid-way along each side of the tool.

Figure 11:
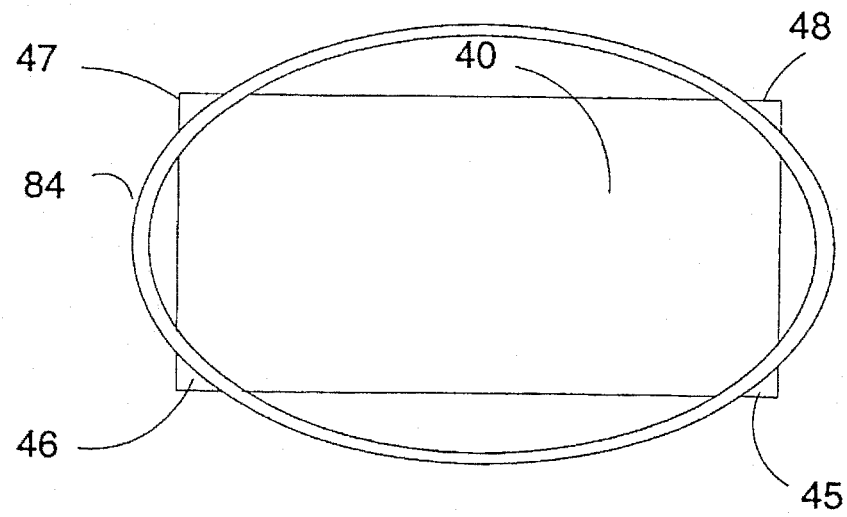
FIG. 11 is a top view of still an oval or elliptical tool in accordance with the present invention engaging an elongated rectangular microchip module.

FIG. 11 illustrates a removal tool 84 which has an elliptical or oval crosssection. This tool is shown engaging an elongated rectangular microchip module 40 the corners 45, 46, 47 and 48 of which are shown projecting slightly beyond the lower periphery of the tool. As in the case of tool 50 and tool 80, the lower periphery of tool 84 includes openings (not visible) to receive the comers and prongs (likewise not visible) to engage the corners.

Figure 12:
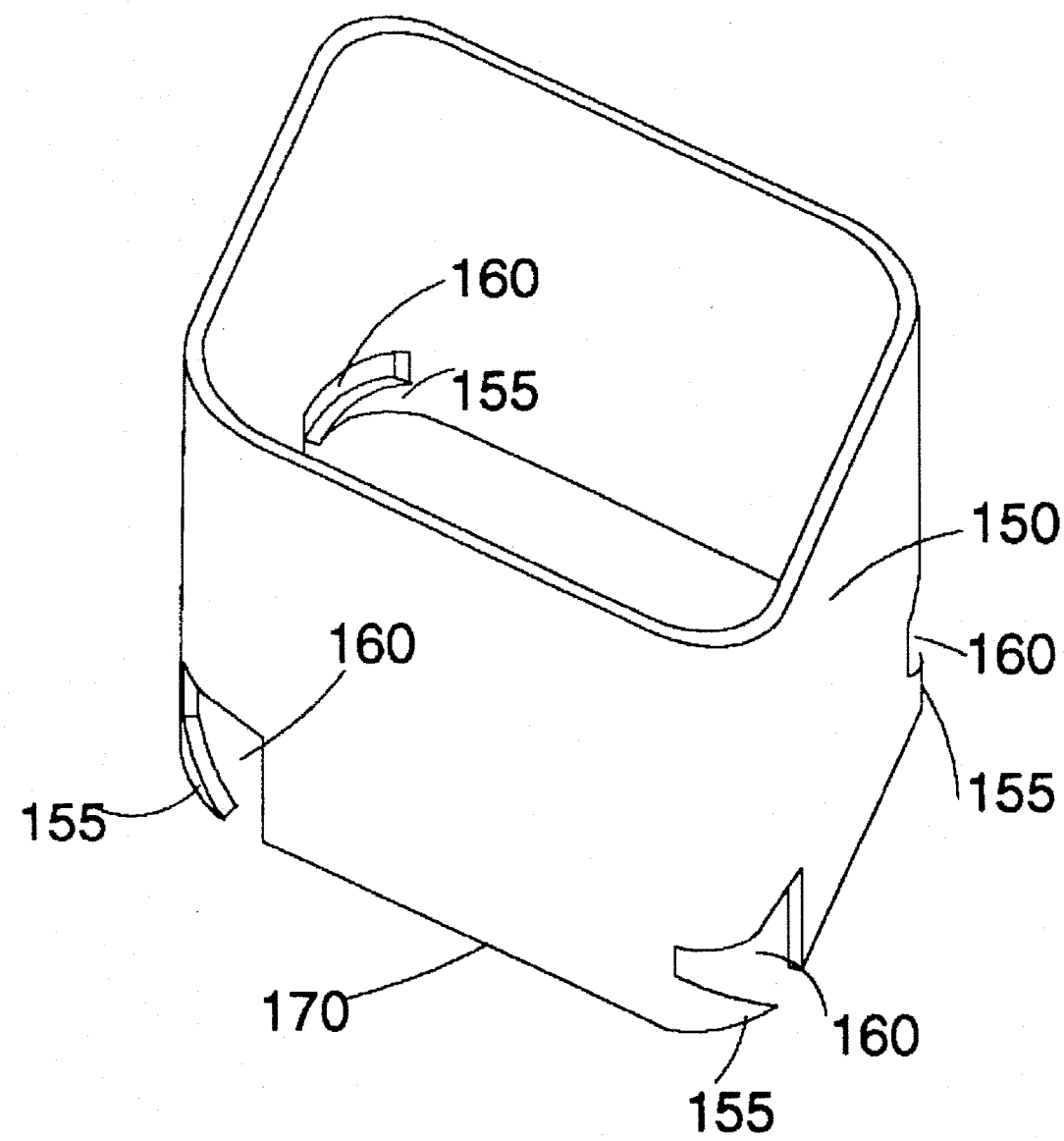
FIG. 12 is an axiometric view of a rounded rectangular removal tool in accordance with the present invention.
Figure 13:
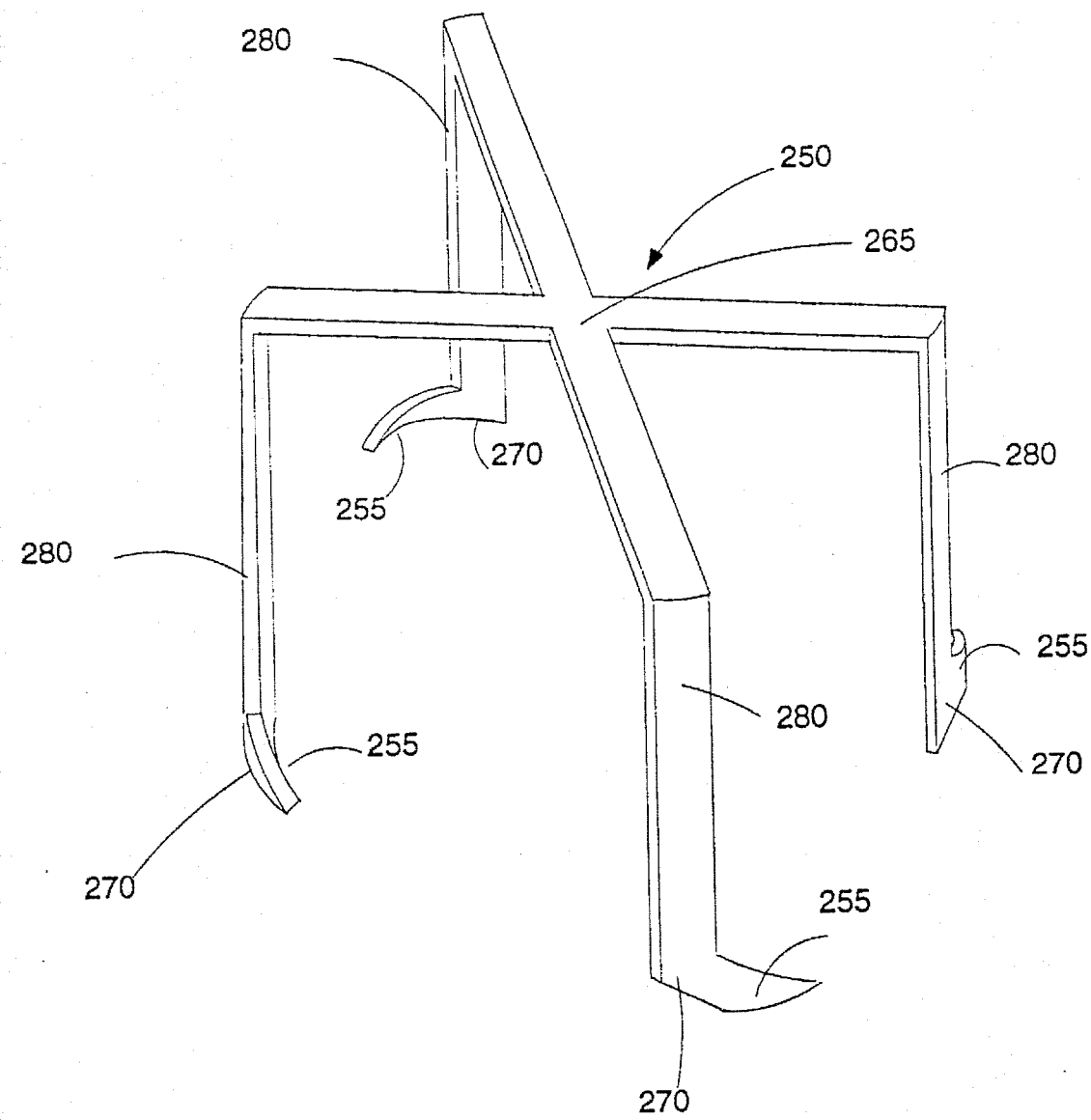
FIG. 13 is an axiometric projection view of a legged removal tool in accordance with the present invention.

The foregoing serves to illustrate that the configuration of the tool is not generally critical except at points where it is expected to receive and engage corners of a microchip module. However, this will not be true in all cases. In some cases, other components near the module may interfere with use of the tool unless the tool is configured to avoid contact with such components. FIGS. 12 and 13 illustrate two such configurations.

FIG. 12 shows a removal tool 150 the lower periphery 170 of which is rectangular with rounded corners. Similar to tool 50, tool 150 includes four prongs 155 extending in openings 160 formed in the lower periphery. As can be seen in FIG. 12, the openings and the prongs are positioned at the corners of the tool.

With a rounded rectangular configuration, the area circumscribed by lower periphery 170 tends to be minimized. In other words, for the same microchip module, a removal tool configured like tool 150 will have a smaller footprint than a removal tool configured like tool 50. Thus, there will be less chance of interference from nearby components when tool 150 is used.

FIG. 13 shows a removal tool generally designated 250 which includes four prongs 255, each prong forming a foot of a corresponding leg 280 which extends downwardly from a cross-membered top portion 265 to the lower periphery 270 of the tool. As can be seen, the lower periphery is essentially defined by the base of the relatively narrow legs 280 and horizontal extension of the prongs 255. The lower periphery of tool 250 may be considered as a lower periphery with large gaps or interruptions in the periphery.

The legged configuration shown in FIG. 13 again minimizes the chances of interference from nearby components when tool 250 is used. However the structure of tool 250 is obviously inherently weaker than that of tool 150. If any of the legs 280 become bent, then the tool will not align properly for the removal of a microchip module.

The removal tools described above each have four prongs, one to act on each corner of a corresponding microchip module. This is desirable to better ensure a balanced lifting action on the corner. Nevertheless, a tool in accordance with the present invention could work with only three prongs acting on three corners of a rectangular microchip module-or, in some cases with only two prongs if the two corresponded with diagonally opposed corners of the module. However, with fewer than four prongs, an unbalance which impairs the ability of the module to lift straight up from its corresponding socket may be produced.

While not shown in the drawings, it is contemplated that a removal tool in accordance with the present invention could be designed to accomodate more than one size of microchip module. For example, with reference to FIG. 13, cross-members performing the function of cross-members 261 and 263 of top portion 265 could be designed to have adjustable lengths. However, added design and manufacturing costs may limit the practicality of such a feature.

In all cases, it will be noted that the pins of the pin lead array extending from a microchip module must be sufficiently distanced from the corners of the module to leave room for the prongs to wedge between the corners of the module and its socket. Obviously, this cannot happen if the prongs are blocked by the pins. Since there are some rectangular microchip module designs where some of the pins are positioned at or project near the corners of the module, the present invention will not be suitable in all cases.

Various modifications and changes to the invention from the embodiments described above are possible within the scope of the following claims and will occur to those skilled in the art.

I claim:

1. A tool for removing a rectangular microchip module having four corners from a corresponding socket gripping a pin lend array extending downwardly from said module, said tool comprising;

(a) an upper portion and a lower portion, said lower portion merging with and extending downwardly about a vertical axis of said tool from said upper portion to a lower periphery of said lower portion; and, (b) a plurality of wedge-shaped prongs positioned around said lower periphery at intervals corresponding with the position of corresponding ones of said corners, said prongs being simultaneously wedgeable between said socket and said corresponding ones of said corners to lift said module away from said socket upon rotation of said upper and lower portions about said axis.

2. A tool as defined in claim 1 wherein said lower periphery and said prongs are formed as an integral part of a thin wall construction.

3. A tool as defined in claim 1 wherein said lower portion is formed by legs extending downwardly from said upper portion, each prong forming a foot of a corresponding one of said legs.

4. A tool as defined in claim 1 wherein each prong extends horizontally from a rearward side of a corresponding opening formed in said lower periphery towards a forward side of said opening, a leading end of said prong being distanced from said forward side by a gap permitting a corresponding corner of said module to be received upwardly in said opening.

5. A tool as defined in claim 4 wherein said lower periphery, said openings and said prongs are formed as an integral part of a thin wall construction.

6. A tool as defined in claim 4 comprising four of said prongs.

7. A tool as defined in claim 6 wherein said lower periphery is substantially circular.

8. A tool as defined in claim 6 wherein said lower periphery is non-circular.

9. A tool as defined in claim 6 wherein said lower periphery is substantially oval.

10. A tool as defined in claim 6 wherein said lower periphery is rectangular with rounded corners, said openings and said prongs being positioned at said corners.

11. A tool as defined in claim 10 wherein said lower periphery, said openings and said prongs are formed as an integral part of a thin wall construction.

* * * * *